United States Patent
Tanaka et al.

(10) Patent No.: US 8,868,008 B2
(45) Date of Patent: Oct. 21, 2014

(54) SWITCH CIRCUIT FOR CONTROLLING A CONNECTION BETWEEN AN ANTENNA AND AN EXTERNAL CIRCUIT

(75) Inventors: Satoshi Tanaka, Kanagawa (JP); Tadashi Matsuoka, Kanagawa (JP); Masanori Iijima, Kanagawa (JP); Yasushi Shigeno, Kanagawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 533 days.

(21) Appl. No.: 13/180,751

(22) Filed: Jul. 12, 2011

(65) Prior Publication Data
US 2012/0081262 A1  Apr. 5, 2012

(30) Foreign Application Priority Data
Sep. 30, 2010  (JP) .................. 2010-221097

(51) Int. Cl.
*H04B 1/44* (2006.01)
*H03K 17/10* (2006.01)
*H03K 17/693* (2006.01)
*H03K 17/62* (2006.01)
*H03K 17/06* (2006.01)

(52) U.S. Cl.
CPC .......... *H03K 17/693* (2013.01); *H03K 17/6221* (2013.01); *H03K 17/102* (2013.01); *H03K 2017/066* (2013.01)
USPC ...................................... 455/83

(58) Field of Classification Search
CPC ............. H04B 1/44; H04B 1/48; H04B 1/525
USPC ............................. 455/78, 79, 80, 81, 82, 83
See application file for complete search history.

(56) References Cited

U.S. PATENT DOCUMENTS

| | | | | |
|---|---|---|---|---|
| 5,548,239 | A * | 8/1996 | Kohama | 327/408 |
| 5,774,792 | A * | 6/1998 | Tanaka et al. | 455/78 |
| 6,693,498 | B1 * | 2/2004 | Sasabata et al. | 333/103 |
| 7,123,898 | B2 | 10/2006 | Burgener et al. | |
| 7,295,814 | B2 * | 11/2007 | Yamashita et al. | 455/83 |
| 7,345,545 | B2 * | 3/2008 | Glass et al. | 330/277 |
| 8,170,560 | B2 * | 5/2012 | Wu | 455/437 |
| 8,385,876 | B2 * | 2/2013 | Goto et al. | 455/333 |
| 8,451,044 | B2 * | 5/2013 | Nisbet et al. | 327/389 |
| 2003/0190895 | A1 * | 10/2003 | Mostov et al. | 455/78 |
| 2005/0079829 | A1 * | 4/2005 | Ogawa et al. | 455/83 |
| 2009/0298443 | A1 * | 12/2009 | Ta et al. | 455/83 |

FOREIGN PATENT DOCUMENTS

JP  2008-11120 A  1/2008

* cited by examiner

*Primary Examiner* — Blane J Jackson
(74) *Attorney, Agent, or Firm* — Mattingly & Malur, PC

(57) ABSTRACT

A switch circuit with a unit capable of improving a margin voltage without using a negative bias generation circuit is provided. A switch comprising an N-type MOSFET is used for a switch passing a signal to an antenna and a switch comprising a P-type MOSFET is used for a shunt switch grounding a signal. A common control signal is input to the gate terminal of the MOSFET constituting each switch. The inverted signal of this control signal is coupled to a ground terminal of the switch, and thus the potential of the gate terminal of each MOSFET can be set to the ground voltage.

11 Claims, 15 Drawing Sheets

TIME CONSTANT REDUCTION PERIOD

TIME CONSTANT REDUCTION PERIOD

SWITCH CIRCUIT FOR CONTROLLING A CONNECTION BETWEEN AN ANTENNA AND AN EXTERNAL CIRCUIT

CROSS-REFERENCE TO RELATED APPLICATION

The disclosure of Japanese Patent Application No. 2010-221097 filed on Sep. 30, 2010 including the specification, drawings and abstract is incorporated herein by reference in its entirety.

BACKGROUND

The present invention relates to switch circuits used in a portable wireless device and the like, and in particular, relates to the prevention of spurious generation in the switch circuit which is used in switching between an input and an output and switching between two or more outputs.

A portable telephone is widely and commonly used. UMTS (W-CDMA) using CDMA (Code Division Multiple Access) as the multiple access of the portable telephone and GSM using TDMA (Time Division Multiple Access) are known as the major systems.

Integration of an RF section of the portable telephone has been progressing, and in GSM, a lot of products having an antenna switch and a power amplifier integrated on the same module (hybrid IC) are used.

At present, the antenna switch is often realized using a pHEMT which is one type of compound semiconductors. However, in order to achieve a reduction in cost, the realization of the antenna switch by means of a silicone device (CMOS) is important.

The related arts include U.S. Pat. No. 7,123,898 B2 (Patent Document 1), which discloses a technique for applying an SOS (Silicon on Safire) CMOS to the switch.

FIG. 1 is a conceptual diagram of this technique described in Patent Document 1. Here, for simplicity of description, an example with one transmission system and one reception system is taken.

The example of Patent Document 1 includes switches M1 and M2 on the transmission side and switches M3 and M4 on the reception-side. All the elements constituting these switches include an nMOSFET of low on-resistance and low power consumption.

In this example, the DC potential of each terminal is the earth potential. The gate voltage of an FET is increased in order to turn on the switch and the gate voltage is reduced in order to turn off the switch. If a power source voltage is 2.7 V and the threshold voltage of the FET is 0.7 V, then there is a margin voltage of 2.0 V from the threshold voltage when the FET is turned on, and there is a margin voltage of 0.7 V when the FET is turned off. Thus, the margins differ between the two states of on/off, and the margin especially in the off state is small. For this reason, when an input RF signal is large, the gate voltage may be forcibly increased by the RF signal and thus the FET may be in a pseudo-on state, resulting in an increase in the loss.

In order to prevent this, in the technique described in Patent Document 1, a negative bias (e.g., −3 V) is generated for the off-operation so as to sufficiently secure the margin voltage in the off-state.

For example, during transmission, +3 V is applied to the gate terminal of the switch M1 and −3 V is applied to the gate terminal of the shunt switch M2. The transmission output is thus coupled to a non-illustrated antenna. In addition, −3 V is applied to the gate terminal of the switch M3 on the reception-side and +3 V is applied to the gate terminal of the shunt switch M4. This decouples the reception input from the antenna. In this case, the margin voltage during off-state is set to 3.7 V, and thus the malfunction of the turned-off FET is suppressed.

Japanese Patent Laid-Open No. 2008-11120 (Patent Document 2) discloses that an nMOS is used for the switches (M1 and M3) on the through-side and a pMOS is used for the switches (M2 and M4) on the shunt-side, and thus the two FETs can be controlled with the same control voltage and the generation of the control signal is simplified.

SUMMARY

However, with the technique described in Patent Document 1, mounting a negative bias generation circuit is indispensable. Accordingly, if the negative bias generation circuit is integrated on the same chip as the switch, the negative bias generation circuit most likely serves as a spurious source because of an oscillator in the negative bias generation circuit.

Moreover, a predetermined time is required for generation of the negative bias. For this reason, it is necessary to apply control timing in consideration of the time required for generation of the negative bias. The technique described in Patent Document 2 has a problem of reduced flexibility in the control sequence.

The present invention has been made in view of the above circumstances and provides the switch circuit with a unit capable of improving the margin voltage without using the negative bias generation circuit.

The other purposes and the new feature of the present invention will become clear from the description of the present specification and the accompanying drawings.

The following explains briefly the outline of a typical invention among the inventions disclosed in the present application.

A switch circuit according to a typical embodiment of the present invention determines whether an antenna is coupled to an external circuit, and includes a first switch passing an output of an external circuit to an antenna and a capacitor positioned at an electrical connection point between the first switch and the external circuit, and also the polarity of a control signal of the first switch is inverted by an inverter and the inverted control signal is coupled to a connection point between the first switch and the capacitor.

This switch circuit may include a first resistor between the connection point and the inverter.

This switch circuit may include a second resistor and a resistor opening/closing switch coupled in parallel to the first resistor, and also the value of the resistor coupled to the inverter is made variable by opening/closing the resistor opening/closing switch.

This switch circuit may further include a one-shot pulse generation circuit to which the control signal of the first switch is input. Moreover, with a change in the control signal of the first switch as a timing, the one-shot pulse generation circuit may open/close the resistor opening/closing switch during a predetermined period.

These switch circuits may be characterized in that the first switch comprises an N-type FET, and the control signal is input to the gate terminal of the N-type FET constituting the first switch.

These switch circuits may be characterized in that the first switch comprises a P-type FET, and the control signal is input to the gate terminal of the P-type FET constituting the first switch.

An alternative switch circuit according to the typical embodiment of the present invention is a switch circuit for determining whether an antenna is coupled to an external circuit, and also the switch circuit, when being decoupled from the antenna, includes a second switch grounding the external circuit, and inverts the polarity of a control signal of the second switch and couples the inverted control signal to the ground terminal of the second switch.

This switch circuit may be characterized in that the second switch comprises an N-type FET, and a control signal is input to the gate terminal of the N-type FET constituting the second switch.

This switch circuit may be characterized in that the second switch comprises a P-type FET, and a control signal is input to the gate terminal of the P-type FET constituting the second switch.

An alternative switch circuit according to the typical embodiment of the present invention is a switch circuit for determining whether an antenna is coupled to an external circuit, and the switch circuit includes the following: a first switch passing the output of the external circuit to the antenna; and a second switch provided in the form of branching from a connection point between the first switch and the external circuit, the second switch being for grounding the external circuit when decoupled from the antenna, and also the first switch and the second switch are controlled with the same control signal, and the control signal is inverted to determine the potential of the ground terminal of the second switch.

This switch circuit may be characterized in that the first switch comprises an N-type FET and the second switch comprises a P-type FET, and also the control signal is input to the gate terminal of the N-type FET constituting the first switch and to the gate terminal of the P-type FET constituting the second switch.

This switch circuit may further include a capacitor positioned at a connection point among the first switch, the second switch, and the external circuit, and also an inverted signal of the control signal is used in charging/discharging the capacitor.

This switch circuit may be characterized in that the inverted signal of the control signal is coupled to the capacitor via a resistor circuit.

This switch circuit may be characterized in that the resistor circuit comprises a plurality of electrically detachable resistors coupled in parallel.

An alternative switch circuit according to the typical embodiment of the present invention determines whether an antenna is coupled either to a transmission circuit or to a reception circuit, and includes the following: a transmission-side switch circuit for determining whether the transmission circuit is coupled to the antenna or the transmission circuit is grounded; and a reception-side switch circuit for determining whether the reception circuit is coupled to the antenna or the reception circuit is grounded, and also the transmission-side switch circuit and the reception-side switch circuit are controlled with one control signal, and the control signal is input to a ground terminal of either one of the transmission-side switch circuit or the reception-side switch circuit, and an inverted signal of the control signal is input to the other ground terminal.

This switch circuit includes a first capacitor at an electrical connection point between the transmission-side switch circuit and the antenna, and a second capacitor at an electrical connection point between the reception-side switch circuit and the antenna, and also the transmission-side switch circuit and the reception-side switch circuit can be set to different DC potentials, respectively.

This switch circuit may include a third capacitor at an electrical connection point between the transmission-side switch circuit and the transmission circuit, and also a signal according to the control signal is used in charging/discharging the third capacitor.

This switch circuit may include a fourth capacitor at an electrical connection point between the reception-side switch circuit and the reception circuit, and also a signal according to the control signal is used in charging/discharging the third capacitor.

An alternative switch circuit according to the typical embodiment of the present invention is a switch circuit for determining whether an antenna is coupled to a transmission circuit, a first reception circuit, or a second reception circuit, and also the switching circuit includes a first reception-side switch circuit for determining whether the first reception circuit is coupled to the antenna or the first reception circuit is grounded, and a second reception-side switch circuit for determining whether the second reception circuit is coupled to the antenna or the second reception circuit is grounded, and an antenna-side terminal of the first reception-side switch circuit and an antenna-side terminal of the second reception-side switch circuit are set to the same DC potential.

An alternative switch circuit according to the typical embodiment of the present invention determines whether a transmission signal is output either to a first transmission circuit or to a second transmission circuit, the switch circuit including a first transmission-side switch circuit for determining whether the transmission signal is output to the first transmission circuit or the first transmission circuit is grounded, and a second transmission-side switch circuit for determining whether the transmission signal is output to the second transmission circuit or the second transmission circuit is grounded, and also the first transmission-side switch circuit and the second transmission-side switch circuit are controlled with one control signal, and the control signal is input to a ground terminal of either one of the first transmission-side switch circuit and the second transmission-side switch circuit, and an inverted signal of the control signal is input to the other ground terminal.

An alternative switch circuit according to the typical embodiment of the present invention determines whether either a bypass signal or an amplified signal serves as a transmission signal and further determines whether the transmission signal is output either to the first transmission circuit or to the second transmission circuit, the switch circuit including a first transmission-side switch circuit for determining whether the transmission signal is output to the first transmission circuit or the first transmission circuit is grounded; and a second transmission-side switch circuit for determining whether the transmission signal is output to the second transmission circuit or the second transmission circuit is grounded, and also the first transmission-side switch circuit and the second transmission-side switch circuit are controlled with one control signal, and the control signal is input to a ground terminal of either one of the first transmission-side switch circuit and the second transmission-side switch circuit, and an inverted signal of the control signal is input to the other ground terminal.

A semiconductor device using the above-described switch circuit and furthermore a portable wireless device using this semiconductor device are within the scope of the present invention.

In the switch circuit according to the present invention, an nMOSFET is used for a through-path passing a signal therethrough, a pMOSFET is used for a shunt-path which turns on in cutting off a signal, the DC potential of the through-path is set to the earth potential in passing a signal, and the DC potential of the through-path is set to a power supply potential VDD in cutting off the signal. Thus, when the nMOSFET turns on, the margin voltage can be set to the power supply potential VDD minus threshold voltage Vth, and when the pMOSFET turns on, the margin voltage can be set to the power supply potential VDD minus threshold voltage Vth.

DETAILED DESCRIPTION

The following embodiments will be explained, divided into plural sections or embodiments, if necessary for convenience. Except for the case where it shows clearly in particular, they are not mutually unrelated and one has relationships such as a variation, details, and supplementary explanation of some or entire of another. In the following embodiments, when referring to the number of elements, etc. (including the number, a numeric value, an amount and a range), they may be not restricted to the specific number but may be greater or smaller than the specific number, except for the case where they are clearly specified in particular and where they are clearly restricted to a specific number theoretically.

Furthermore, in the following embodiments, it is needless to say that an element is not necessarily indispensable, except for the case where it is clearly instructed in particular and where it is considered to be clearly indispensable from a theoretical point of view. Moreover, the circuit elements constituting each functional block of the embodiments are not limited in particular, but are formed over a semiconductor substrate of single crystal silicon or the like using an integrated circuit technique for a CMOS (complementary MOS transistor) or the like. It should be noted that, when a MOSFET (Metal Oxide Semiconductor Field Effect Transistor; or abbreviated as an MOSFET transistor) is referred to in the embodiments, a non-oxide film shall not be excluded as the gate insulating film.

Hereinafter, the embodiments of the present invention will be described using the accompanying drawings.

First Embodiment

Figure 1:
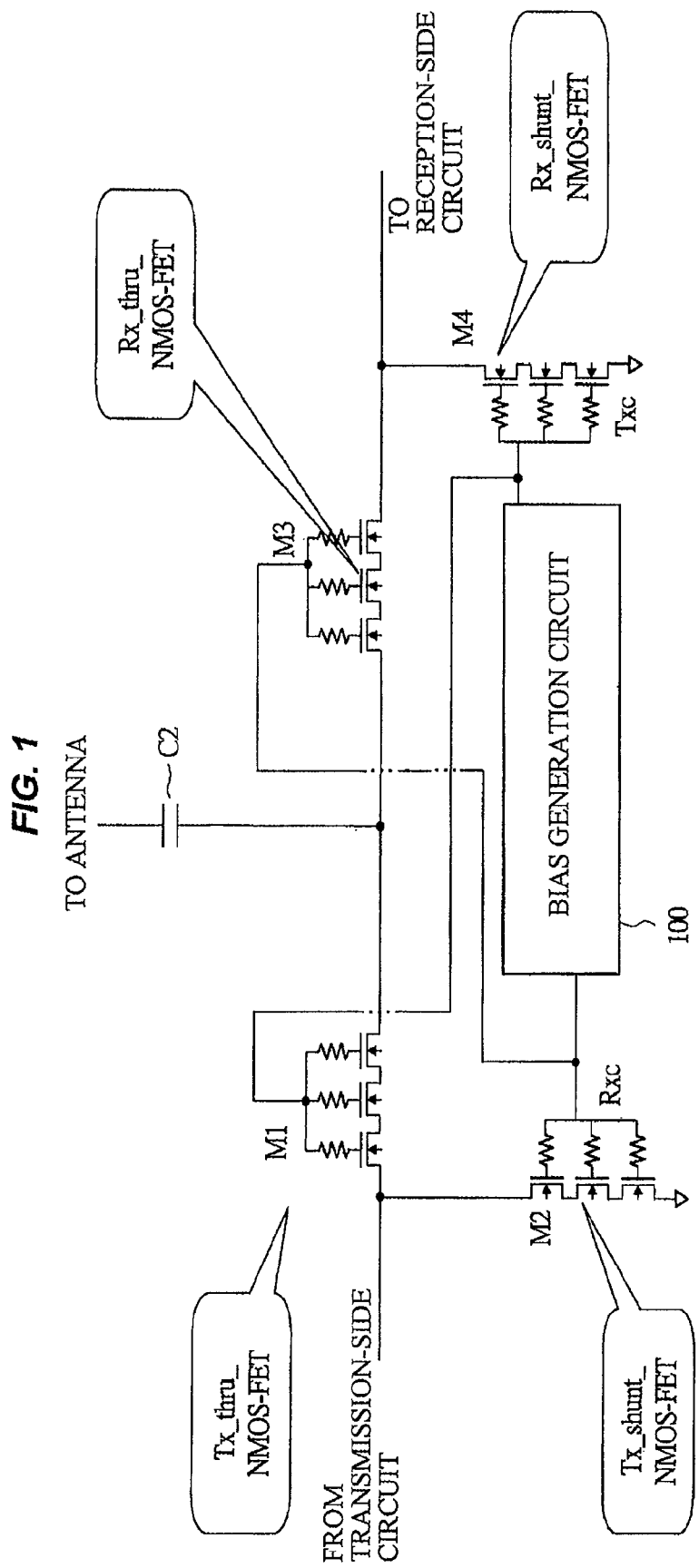
FIG. 1 is a conceptual diagram of the technique described in Patent Document 1.
Figure 2:
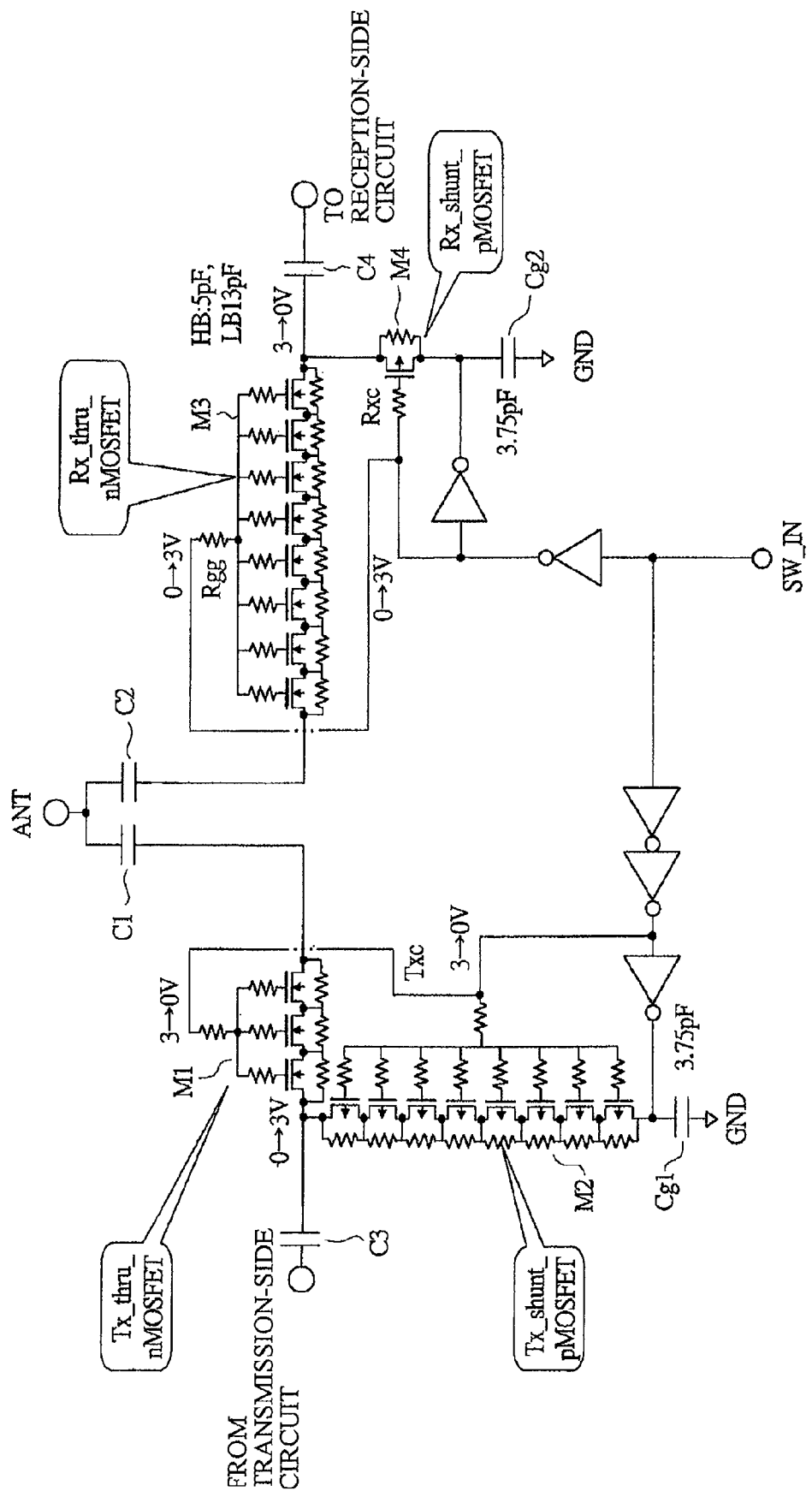
FIG. 2 is a circuit diagram representing the configuration of a switch circuit according to a first embodiment of the present invention.
Figure 3:
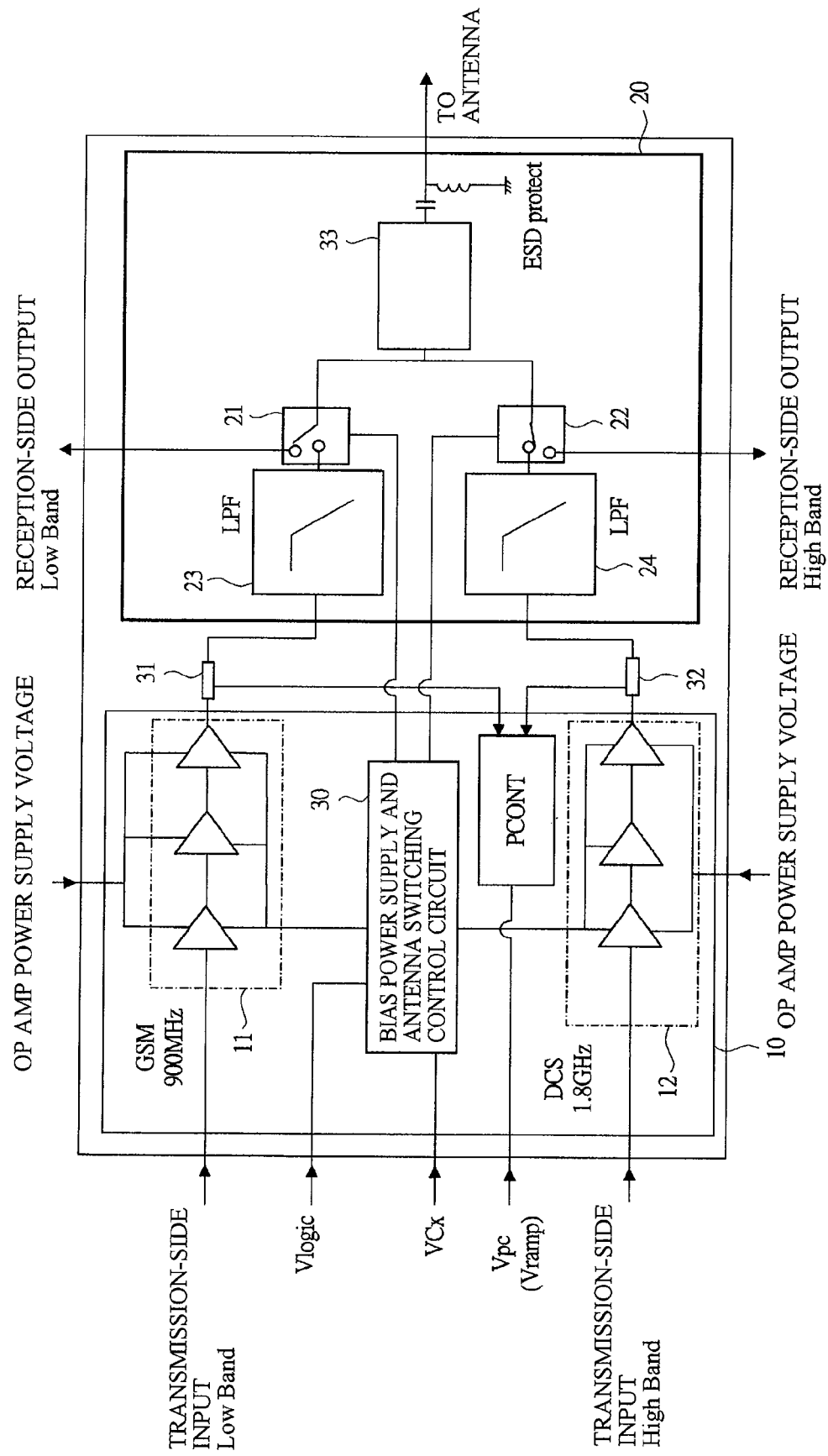
FIG. 3 is a conceptual diagram representing how the switch circuit of FIG. 2 is used in an antenna switch.

FIG. 2 is a circuit diagram representing the configuration of a switch circuit according to a first embodiment of the present invention. FIG. 3 is a conceptual diagram representing how the switch circuit of FIG. 2 is used in an antenna switch.

As with the conventional one, in this switch circuit, an SPDT (Single Pole Double Throw) configuration is also employed where one antenna is switched to a transmission circuit or a reception circuit.

A transmission-side switch circuit includes the following: a through-switch M1 including a plurality of N-type MOSFET rows; a shunt switch M2 including P-type MOSFET rows; a capacitor Cg1 for AC-grounding one end of M2; and a control circuit including peripheral circuits such as an inverter circuit. Moreover, an antenna-switching input terminal SW_IN is present as an input terminal of this switch circuit. The transmission-side switch circuit is coupled to a non-illustrated transmission-side circuit via a capacitor C3 at a point where the switch M1 and the switch M2 are coupled to each other.

The antenna-switching input terminal SW_IN is for inputting a selection signal which switches whether the antenna ANT is coupled to the non-illustrated transmission-side circuit or to a non-illustrated reception-side circuit. When an "H" level is input to this antenna-switching input terminal SW_IN, the transmission-side is selected, while when an "L" level is input, the antenna ANT is coupled to the reception-side circuit. On this diagram, the polarity of the antenna-switching input terminal SW_IN is set to "H" during transmission, while during reception, it is set to "L". However, these "H" and "L" may be reversed by adjusting the number of inserted inverters.

The switch M1 is a switch on the through-side for passing a transmission-path-encoded transmission signal, which is output from a non-illustrated transmission circuit, to the antenna. On this diagram, the switch M1 comprises three N-type MOSFETs. However, the number of MOSFETs can be suitably modified, and is not limited to this number.

Each MOSFET constituting the switch M1 determines whether the transmission-path-encoded transmission signal is transmitted to the antenna through the source terminal and the drain terminal. To the gate terminal of each MOSFET constituting the switch M1, the signal at the antenna-switching input terminal SW_IN is input with its polarity as it is. That is, when the antenna-switching input terminal SW_IN is at an "H" level, the switch M1 is conducted, and thus the non-illustrated transmission-side circuit is coupled to the antenna ANT. In contrast, when the antenna-switching input terminal SW_IN is at an "L" level, the non-illustrated transmission-side circuit is decoupled from the antenna ANT.

The switch M2 is a shunt switch for determining whether the non-illustrated transmission-side circuit is grounded. In this diagram, the switch M2 comprises eight P-type MOSFETs. However, the number of MOSFETs can be suitably modified, and is not limited to this number.

Each MOSFET constituting the switch M2 couples the transmission-side circuit to the ground potential via a resistor coupled in parallel between the source terminal and the drain terminal. Then, the signal input to the gate terminal of each MOSFET constituting the switch M2 serves as the control signal for opening/closing the switch M2.

It should be noted that the MOSFETs constituting the switch in each embodiment of the present invention, unless otherwise stated, shall be coupled to each other by means of a resistor coupled in parallel to the source and drain of the MOSFET.

Also to the gate terminal of each MOSFET constituting the switch M2, the signal at the antenna-switching input terminal SW_IN is input with the polarity as it is. That is, when the antenna-switching input terminal SW_IN is at an "H" level, the switch M2 is decoupled from the ground. Moreover, when the antenna-switching input terminal SW_IN is at an "L" level, the non-illustrated transmission-side circuit is grounded.

The switch M2 is grounded via a grounding capacitor Cg1.

To the connection point between the terminal on the earth side of the switch M2 and the grounding capacitor Cg, the signal at the antenna-switching input terminal SW_IN is coupled with its polarity being inverted. When the antenna-switching input terminal SW_IN is at an "H" level, the AC-ground terminal of the switch M2 is set to 0 V. Thus, via the resistor coupled in parallel to each switch, all the DC potentials of the switch path on the transmission-side can be set to 0 V.

If the threshold voltage Vth of the N-type MOSFET used for the switch M1 is 0.7 V, the margin voltage in the on-state becomes 2.3 V.

On the other hand, the gate terminal of the switch M2 is also set to the power supply voltage. Since the switch M2 comprises a P-type MOSFET, the margin voltage in the off-state becomes 3.7 V.

On the other hand, the reception-side switch circuit includes the following: a through-switch M3 including a plurality of N-type MOSFET rows; a shunt switch M4 including a P-type MOSFET; a capacitor Cg2 for AC-grounding one end of M2; and a control circuit including peripheral circuits such as an inverter circuit. Moreover, as the input terminal for controlling this switch circuit, there is the antenna-switching input terminal SW_IN which is used also on the transmission-side. The reception-side switch circuit is electrically coupled from the connection point between the switch M3 and the switch M4 to the non-illustrated reception-side circuit via a capacitor C4.

The switch M3 is a through-switch for determining whether or not a signal received by the antenna ANT is coupled to the non-illustrated reception-side circuit. On this diagram, the switch M3 comprises eight N-type MOSFETs. However, the number of MOSFETs can be suitably modified, and is not limited to this number. Moreover, although the gate width of each N-type MOSFET of the switch M3 is assumed to be 6000 μm, the gate width and the gate length can be suitably modified.

Each MOSFET constituting the switch M3 transmits a signal, which is received by the antenna ANT, to the reception-side circuit through the source terminal and the drain terminal. To the gate terminal of this MOSFET, the signal at the antenna-switching input terminal SW_IN is input after the polarity thereof is inverted. That is, when the antenna-switching input terminal SW_IN is at an "L" level, the switch M3 is conducted, and thus the antenna ANT is coupled to the non-illustrated reception-side circuit. In contrast, when the antenna-switching input terminal SW_IN is at an "H" level, the antenna ANT is decoupled from the non-illustrated reception-side circuit.

The switch M4 is a shunt switch for determining whether the non-illustrated reception-side circuit is grounded. In this diagram, the switch M4 comprises one P-type MOSFET. However, the number of MOSFETs can be suitably modified, and is not limited to this number.

The MOSFET constituting the switch M4 couples the reception-side circuit to the ground potential via a resistor coupled in parallel between the source terminal and the drain terminal. The signal at the antenna-switching input terminal SW_IN is input to the gate terminal of this MOSFET with its polarity being inverted. That is, when the antenna-switching input terminal SW_IN is at an "L" level, the switch M4 is decoupled from the ground. Moreover, when the antenna-switching input terminal SW_IN is at an "H" level, the input terminal of the non-illustrated reception-side circuit is grounded.

The switch M4 is grounded via the grounding capacitor Cg2.

To the connection point between the terminal on the ground side of the switch M4 and the grounding capacitor Cg2, the signal at the antenna-switching input terminal SW_IN is coupled via two inverters. When the antenna-switching input terminal SW_IN is at an "L" level, the AC grounding terminal which is the connection point between the switch M4 and the grounding capacitor Cg2 is set to 0 V.

The AC ground terminal of the switch M4 on the reception-side is set to 3.0 V. The DC potential of the switch path on the reception-side is set to 3.0 V via a resistor provided in parallel to the MOSFET in the switch M4. Moreover, the gate terminal voltage of the switch M3 is set to the earth potential (=0.0 V).

If the threshold voltage Vth of the N-type MOSFET used in the switch M3 is 0.7 V, the margin voltage in the ON state becomes 2.3 V (=3.0 V−0.7 V). On the other hand, the gate terminal of the switch M4 is also set to the power supply voltage. Since the switch M4 comprises a P-type MOSFET, the margin voltage in the on-state becomes 2.3 V.

As described above, at the same timing, the switches M1 and M2 on the transmission-side and the switches M3 and M4 on the reception-side need to be set to different DC potentials, respectively. A unit for realizing this is an incremental capacitor C1 arranged between the antenna ANT and the switch M1. Insertion of this prevents the DC-component on the transmission-side from being generated on the reception-side, or vice versa. As a result, in this switch circuit, although the transmission terminal is separated from the antenna terminal in terms of DC, the AC coupling can be maintained.

It should be noted that the capacitance value of the incremental capacitor C1 is determined according to the frequency and transmission/reception method to be used.

Next, referring to FIG. 3, how the switch circuit of FIG. 2 is applied to a power amplifier module will be described.

FIG. 3 is a block diagram of the power amplifier module using the switch circuit according to the first embodiment of the present invention.

The power amplifier module in this diagram comprises an amplifier 10 and an antenna switch 20.

The amplifier 10 in this diagram supports two frequency bands: the high frequency side (1.8 GHz) and the low frequency side (900 MHz), and three-stage amplifiers 11 and 12 are arranged on the respective sides. Moreover, the amplifier 10 includes a bias current/antenna switching control circuit 30. By means of the bias current/antenna switching control circuit 30, the bias current supplied to each stage of the three-stage amplifiers 11 and 12 and the later-described switches 21 and 22 are controlled.

The outputs of the three-stage amplifiers 11 and 12 are input to the antenna switch 20 via couplers 31 and 32. LPFs 23 and 24 remove harmonic components from the output signals of the couplers 31 and 32, and output the resulting signals to the switches 21 and 22.

The switches 21 and 22 are for switching between the transmission signals which are the outputs of LPFs 23 and 24 and the reception signals sent from the antenna ANT. The switch circuit represented by FIG. 2 is applied to these switches 21 and 22.

A diplexer 33 combines the outputs of the 900 MHz band and 1.8 GHz band with the transmission signal sent from each switch, and couples the combined signal to the antenna ANT.

By employing the configurations as described above, both the potential of the signal line and the potential of the gate terminal of the MOSFET used as the switch can be varied. Thus, a sufficient margin voltage can be secured without using a negative bias generation circuit.

Second Embodiment

Next, a second embodiment of the present invention will be described.

In the first embodiment, the signal at the antenna-switching input terminal SW_IN has been applied to the AC-signal grounding point via the inverters. In this case, it may take time to charge/discharge the accumulated charge in the capacitor C3 coupled to the input terminal on the transmission-side (see, FIG. 2 etc.).

However, the GSM specification widely used centering on Europe employs TDMA (Time Division Multiple Access). Accordingly, under the requirements of the time division control, the charging/discharging needs to be promptly completed.

According to the embodiment, an inverter is provided not only to the ground terminal but to the transmission input terminal via a resistor, and thus a DC potential can be set.

Figure 4:
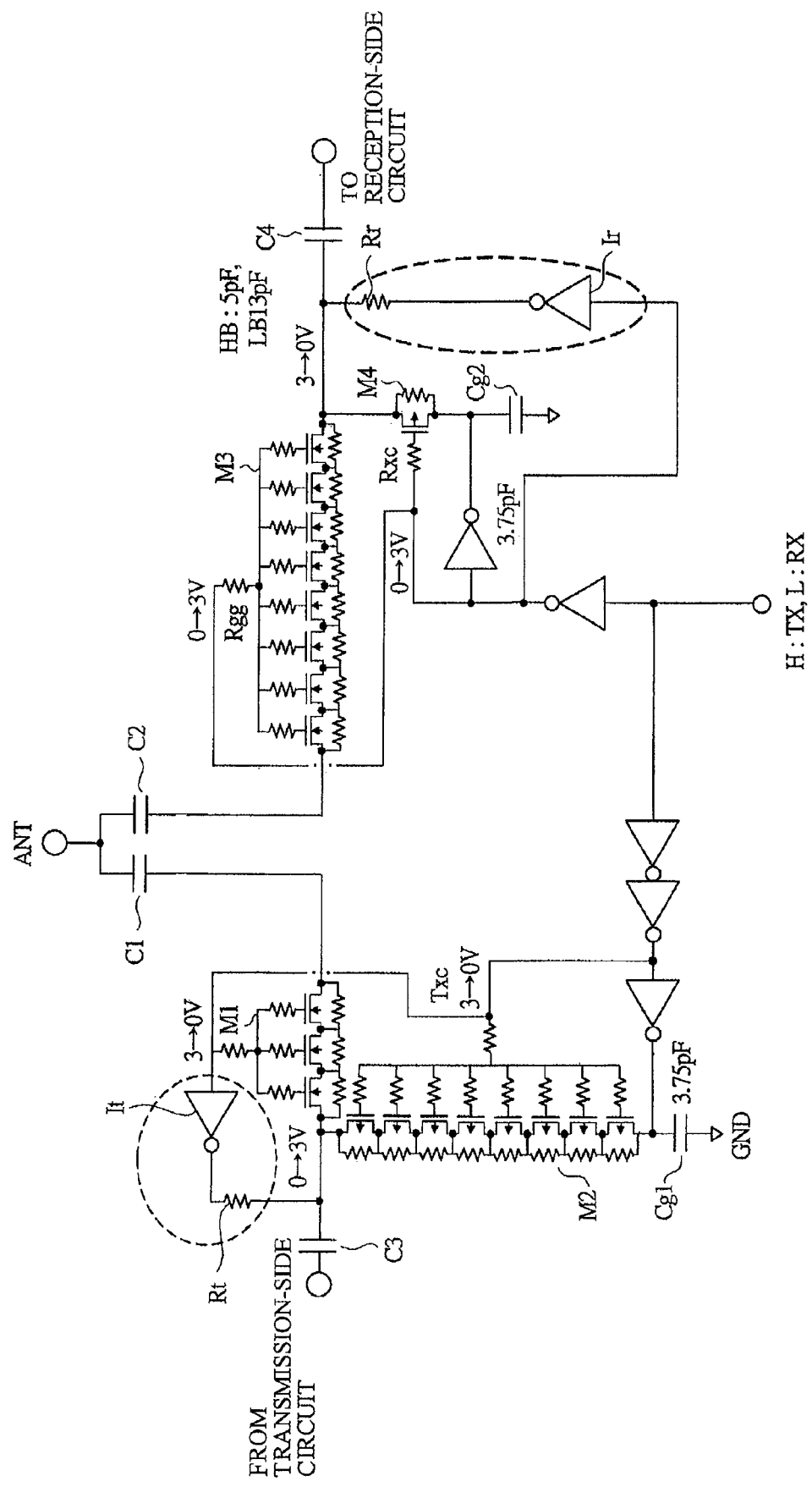
FIG. 4 is a circuit diagram representing the configuration of a switch circuit according to a second embodiment of the present invention.

FIG. 4 is a circuit diagram representing the configuration of a switch circuit according to the second embodiment of the present invention.

As apparent from this diagram, with regard to the transmission side, the signal coupled to the gate terminals of the switches M1 and M2 according to the first embodiment is coupled to the capacitor C3 via an inverter It and a resistor Rt. Moreover, also with regard to the reception side, the signal coupled to the gate terminals of the switches M3 and M4 is coupled to the capacitor C4 via an inverter Ir and a resistor Rr.

By inverting the signal input to the gate terminal of the switch and directly coupling the inverted signal to the capacitors C3 and C4 respectively in this manner, the charging/discharging is speeded up.

However, this countermeasure cannot be enough.

That is, the resistors Rt and Rr in this diagram are considered to be set to a value exceeding several-hundred kilo-ohms in order to avoid the influence of distortion of the waveform. However, if such a large resistance is inserted, a sufficient speed in charging/discharging is also considered not to be obtained.

Figure 5:
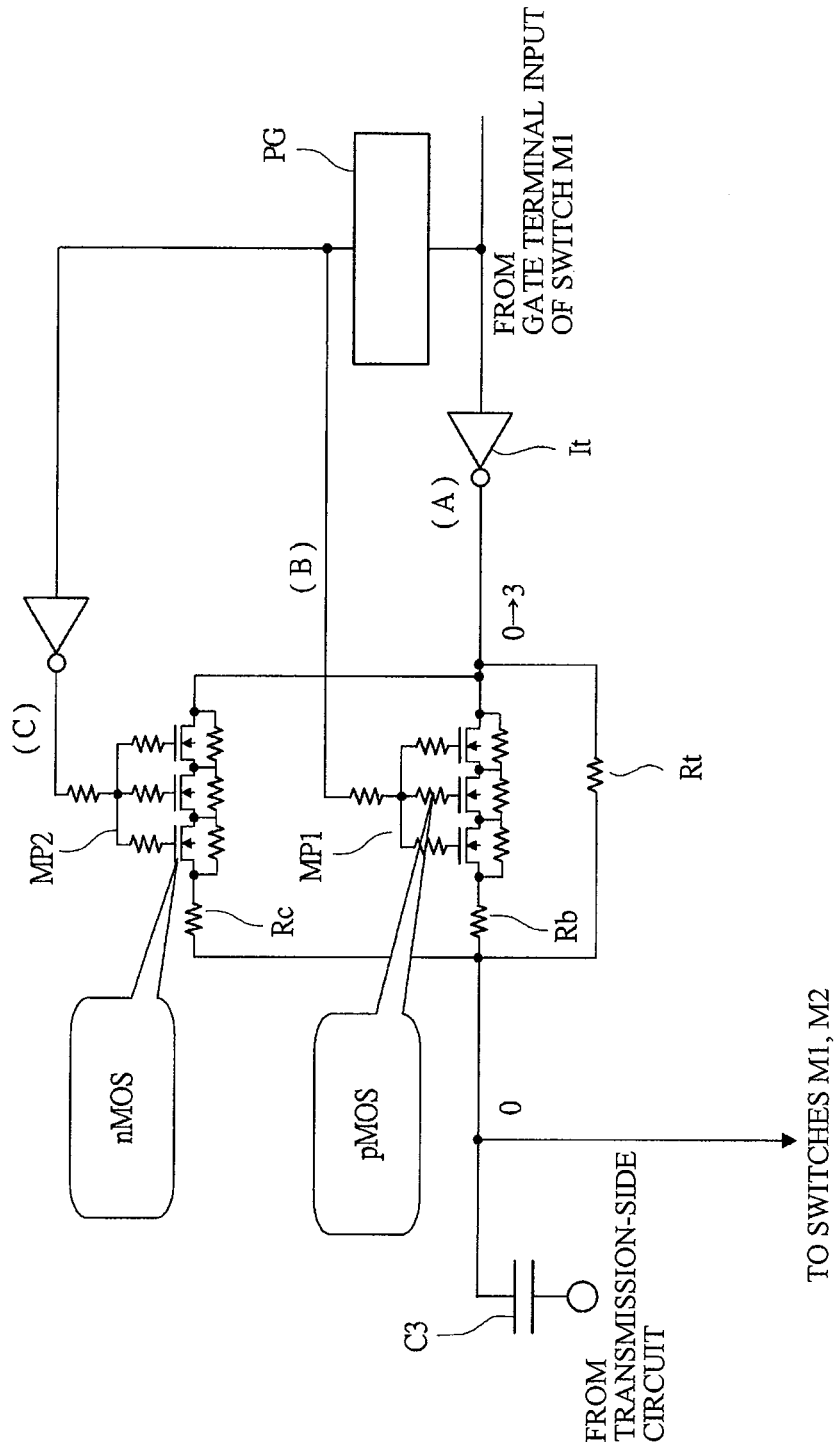
FIG. 5 is a circuit diagram representing the configuration of a charging circuit according to the second embodiment of the present invention.

FIG. 5 is a circuit diagram representing the configuration of a charging circuit according to the second embodiment of the present invention.

This charging circuit is provided in addition to the inverter It and resistor Rt of FIG. 4. Accordingly, the inverter It and resistor Rt of this diagram are the same as the inverter It and resistor Rt used in FIG. 4.

This charging circuit is characterized in modifying the resistance value by opening/closing resistors Rb and Rc electrically arranged in parallel to the resistor Rt. Complementary switches MP1 and MP2 are used in opening/closing these resistors Rb and Rc.

The switch MP1 is a switch circuit including a P-type MOSFET, while the switch MP2 is a switch circuit including an N-type MOSFET.

A one-shot pulse generation circuit PG generates a one-shot pulse for operating the complementary switch MP1 and MP2. The operation conditions of the one-shot pulse generation circuit PG depend on rise and fall of the signal input to the gate terminal of the switch M1. When the operation conditions are satisfied, the one-shot pulse generation circuit PG outputs a one-shot pulse.

Figure 6A:
FIG. 6 is a waveform chart representing the voltage waveform of each measure point of the charging circuit when the output voltage of an inverter rises.
Figure 6B:
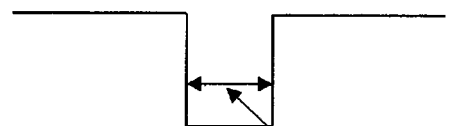
Figure 6C:
Figure 7A:
FIG. 7 is a waveform chart representing the voltage waveform of each measure point of the charging circuit when the output voltage of the inverter falls.
Figure 7B:
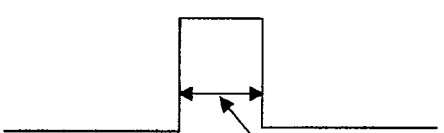
Figure 7C:
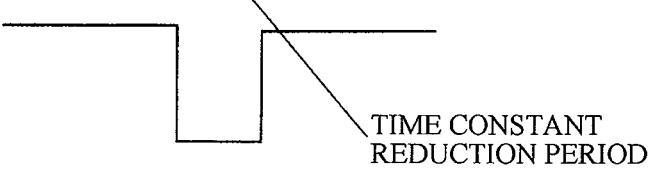

Numerals (A), (B), and (C) in this diagram represent the measurement points of the voltage waveforms of FIGS. 6 and 7. Numeral (A) represents the output (operation condition of the one-shot pulse generation circuit PG) of the inverter It, (B) represents the gate terminal of the switch MP1 including a P-type MOSFET, and (C) represents the gate terminal of the switch MP2 including an N-type MOSFET, respectively.

It should be noted that, on the diagram, two resistors: the resistor Rb using a P-type MOSFET as the switch and the resistor Rc using an N-type MOSFET as the switch, are coupled in parallel to the resistor Rt. However, even a configuration using either one of these resistors would not pose a problem. Moreover, even the use of the same type of MOSFET for the both resistors Rb and Rc would not pose a problem.

FIG. 6 is a waveform chart representing the voltage waveforms of the charging circuit when the output voltage of the inverter It rises. Furthermore, FIG. 7 is a waveform chart representing voltage waveforms of the charging circuit when the output voltage of the inverter It falls.

As apparent from these diagrams, while the one-shot pulse generation circuit PG outputs the pulse waveform, the resistance value of the whole circuit decreases due to the switch and resistors Rb and Rc coupled in parallel. Thus, the time constant is reduced and the charging/discharging to the capacitor C3 is accelerated.

Next, back to the operation of the further upstream-side switch 1. When the switch M1 is in the on-state, the voltage between the switch M1 and the capacitor C3 is biased to 0 V. In order to switch the switch M1 to the off-state, the connection point between the switch M1 and the capacitor C3 is switched to "H", i.e., to 3.0 V. At the time of this rise, the one-shot pulse generation circuit PG outputs a one-shot pulse represented by (b) and (c) in FIGS. 6 and 7. In this case, the time length of the pulse the one-shot pulse generation circuit PG outputs can be appropriately modified. If the time length of the pulse the one-shot pulse generation circuit PG outputs, the time length governing the period of the reduced resistance value, is increased, the acceleration period for charging/discharging can be increased.

The resistance value between the inverter It and the capacitor C3 decreases during the period determined by the output pulse width of the one-shot pulse generation circuit PG. This allows the reduction of the response time.

In FIG. 5, the adjustment of the time constant of the resistor Rt coupled to the transmission-side circuit has been described. However, it is also possible to apply the additional circuit of FIG. 5 to the resistor Rr and inverter Ir coupled to the reception-side circuit of FIG. 4. In FIG. 4 and the following FIGS. 8, 12 and 16, the portion to which the charging circuit of FIG. 5 can be applied shall be encircled with a dotted line.

In this manner, the charging/discharging is accelerated by directly coupling a DC potential to the input terminal on the transmission-side and to the output terminal on the reception-side and by reducing the resistance value for a predetermined period, and thus the charging/discharging of the capacitor can be accelerated.

Third Embodiment

Next, a third embodiment of the present invention will be described.

In the first embodiment, a power amplifier module has been described, and a switch is inserted to the 900 MHz band and the 1.8 GHz band, respectively, so as to control the transmission and reception.

In the embodiment, a total of four bands, two bands of 850 MHz and 900 MHz as the 1 GHz band and two bands of 1.8 GHz and 1.9 GHz as the 2 GHz band, is assumed to be supported.

Figure 8:
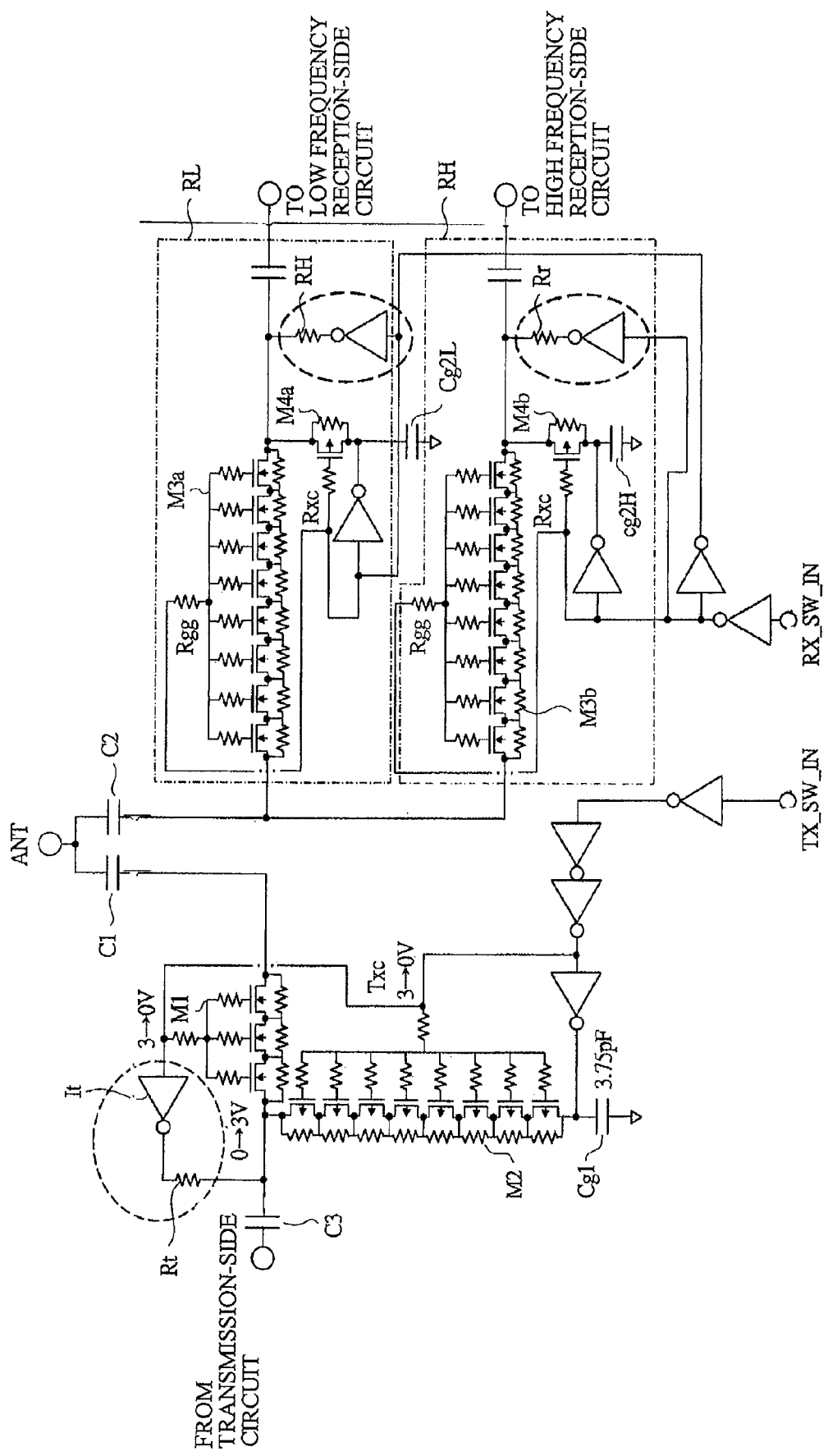
FIG. 8 is a circuit diagram representing the configuration of a switch circuit according to a third embodiment of the present invention.
Figure 9:
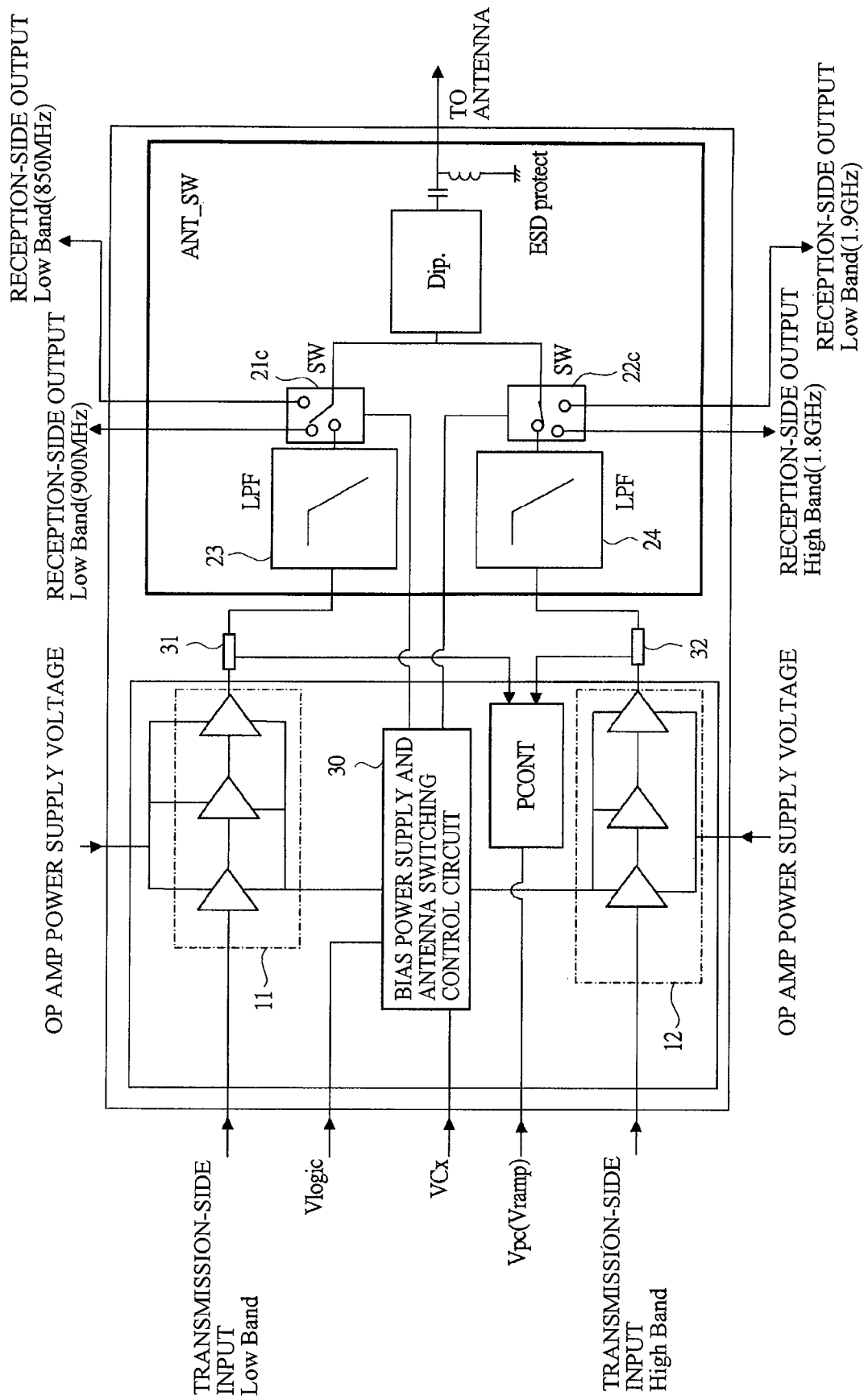
FIG. 9 is a conceptual diagram representing how the switch circuit of FIG. 8 is used in the antenna switch.

FIG. 8 is a circuit diagram representing the configuration of a switch circuit according to the third embodiment of the present invention. FIG. 9 is a conceptual diagram representing how the switch circuit of FIG. 8 is used in the antenna switch.

In the first embodiment, the control input terminal is only the antenna-switching input terminal SW_IN. In contrast, in the embodiment, the reception-side circuit includes two reception circuits of switches M3$a$ and M4$a$ of a low frequency system and switches M3$b$ and M4$b$ of a high frequency system, respectively.

It should be noted that, with regard to the transmission-side, by adjusting the bias current and the like, power amplifiers 11 and 12 can support two frequencies. Accordingly, the description about the transmission-side is omitted because it is the same as the second embodiment.

In the reception-side circuits, a mutually-independent interference wave blocking SAW (surface acoustic wave) filter needs to be provided, respectively. For this reason, each band-specific output is needed. In FIG. 8, the switches M3$a$ and M4$a$ of a low frequency system are referred to as a low frequency-side switch circuit RL, while the switches M3$b$ and M4$b$ of a high frequency system are referred to as a high frequency-side switch circuit RH.

In the first embodiment, there is only one antenna-switching input terminal SW_IN. In contrast, in the embodiment, there are two inputs: a transmission-side antenna-switching input terminal TX_SW_IN and a reception-side antenna-switching input terminal RX_SW_IN.

The transmission-side antenna-switching input terminal TX_SW_IN is an input terminal for determining whether the transmission side is activated. When this terminal is at an "H" level, the output of the transmission-side circuit is coupled to the antenna. On the other hand, when this terminal is at an "L" level, the output of the transmission-side circuit is grounded via the shunt switch M2.

The reception-side antenna-switching input terminal RX_SW_IN is an input terminal for determining whether either the low frequency-side switch circuit RL or the high frequency-side switch circuit RH is activated. When this terminal is at an "H" level, the low frequency-side switch circuit RL is activated. On the other hand, when this terminal is at a "L" level, the high frequency-side switch circuit RH is activated.

Such a large electric power as up to 2 W is applied to the non-illustrated transmission-side circuit. In contrast, the reception-side circuit permits only power in the order of 1 mW at the maximum to pass therethrough. For this reason, the low frequency-side switch circuit RL and the high frequency-side switch circuit RH are directly coupled to the capacitor C2 to provide the same DC potential. Even in this case, although the on/off margin voltage decreases, the performances sufficient for reception can be obtained. In addition, the number of the DC cut-off capacitors can be reduced.

Figure 10:
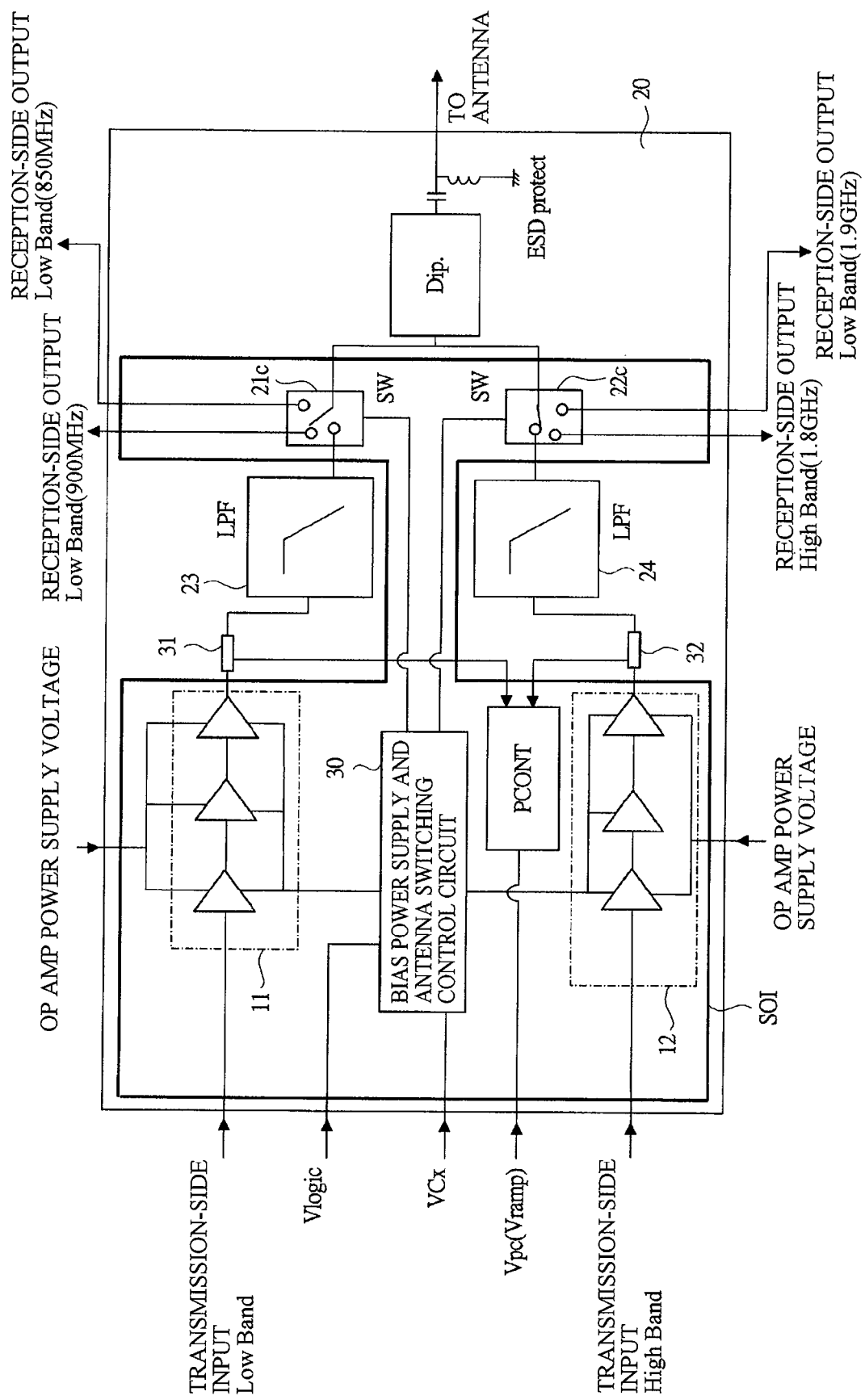
FIG. 10 is a diagram representing an example having the antenna switch of FIG. 9 integrated on one chip SOICMOS integrated circuit.

FIG. 10 is a diagram representing an example having the antenna switch of FIG. 9 integrated on one chip SOICMOS integrated circuit. Like this diagram, the couplers 31 and 32 and LPFs 23 and 24, in which there is room for selecting components according to a desired frequency used for transmission, are arranged outside the SOICMOS, and thus room for selecting components can be left.

By setting a plurality of reception signal systems to the same DC potential in this manner, the increase in the number of DC cut-off capacitors can be prevented.

Fourth Embodiment

Next, a fourth embodiment of the present invention will be described.

In the preceding embodiments, an N-type MOSFET having a small loss has been applied to the switches M1 and M3 which pass a signal to the antenna. However, when there is no need to consider the loss, a P-type MOSFET may be used for the switches M1 and M3 which pass a signal to the antenna.

Figure 11:
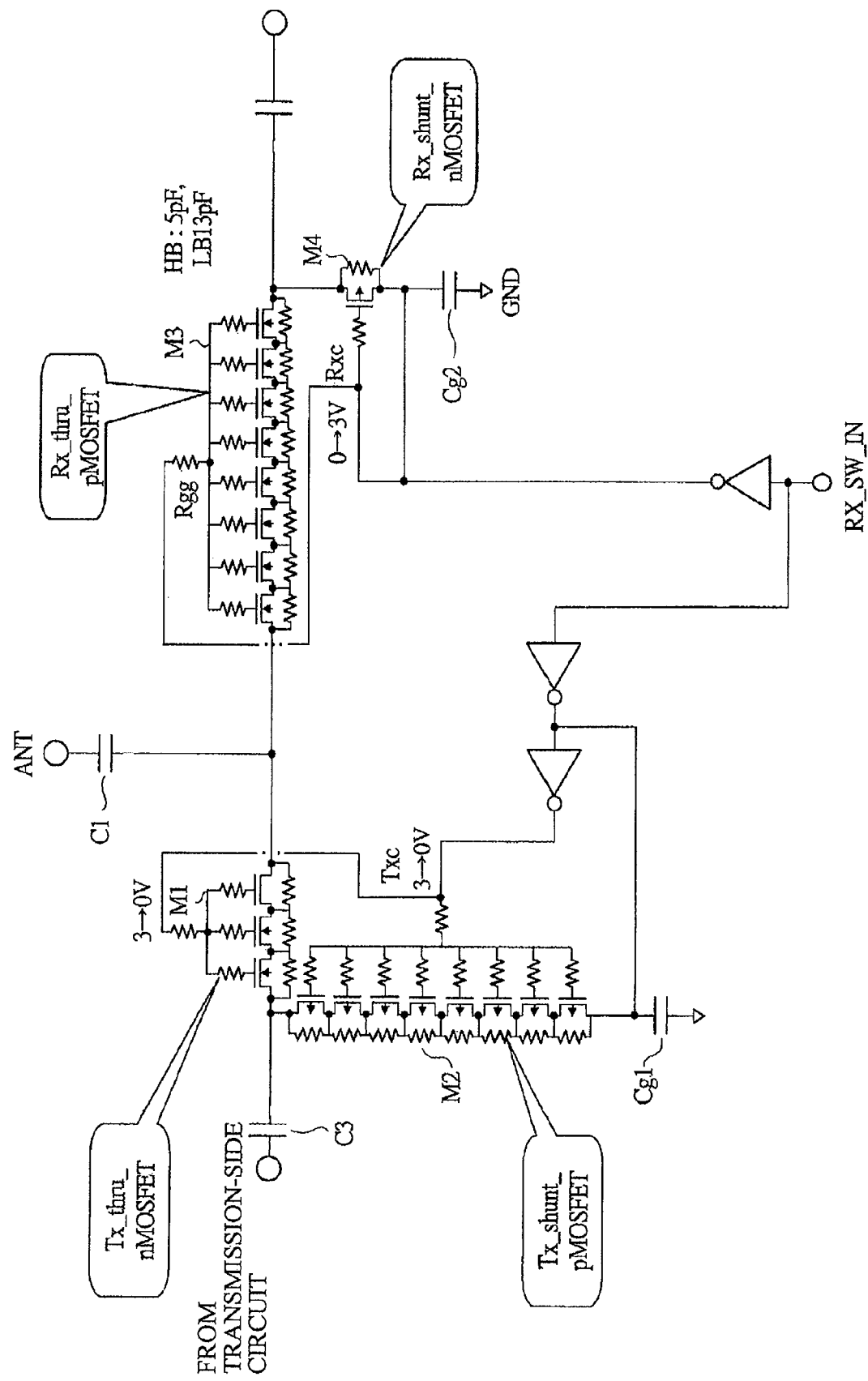
FIG. 11 is a circuit diagram representing the configuration of a switch circuit according to a fourth embodiment of the present invention.

FIG. 11 is a circuit diagram representing the configuration of a switch circuit according to the fourth embodiment of the present invention. In this diagram, an N-type MOSFET is used for the switch M1 on the transmission-side and a P-type MOSFET is used for the shunt switch M2. On the other hand, in the reception-side switch circuit, a P-type MOSFET is used for the switch M3 and an N-type MOSFET is used for the shunt switch M4. In this case, even if the same DC bias is applied to the input signal system and to the output signal system, the same margin voltage as the first embodiment can be secured.

Fifth Embodiment

Next, a fifth embodiment of the present invention will be described.

The above first to fourth embodiments have been described on the assumption of the second-generation multi-channel access, such as GSM, using TDMA. In contrast, in the embodiment, performing output switching by means of the third-generation multi-channel access, such as W-CDMA is assumed.

Figure 12:
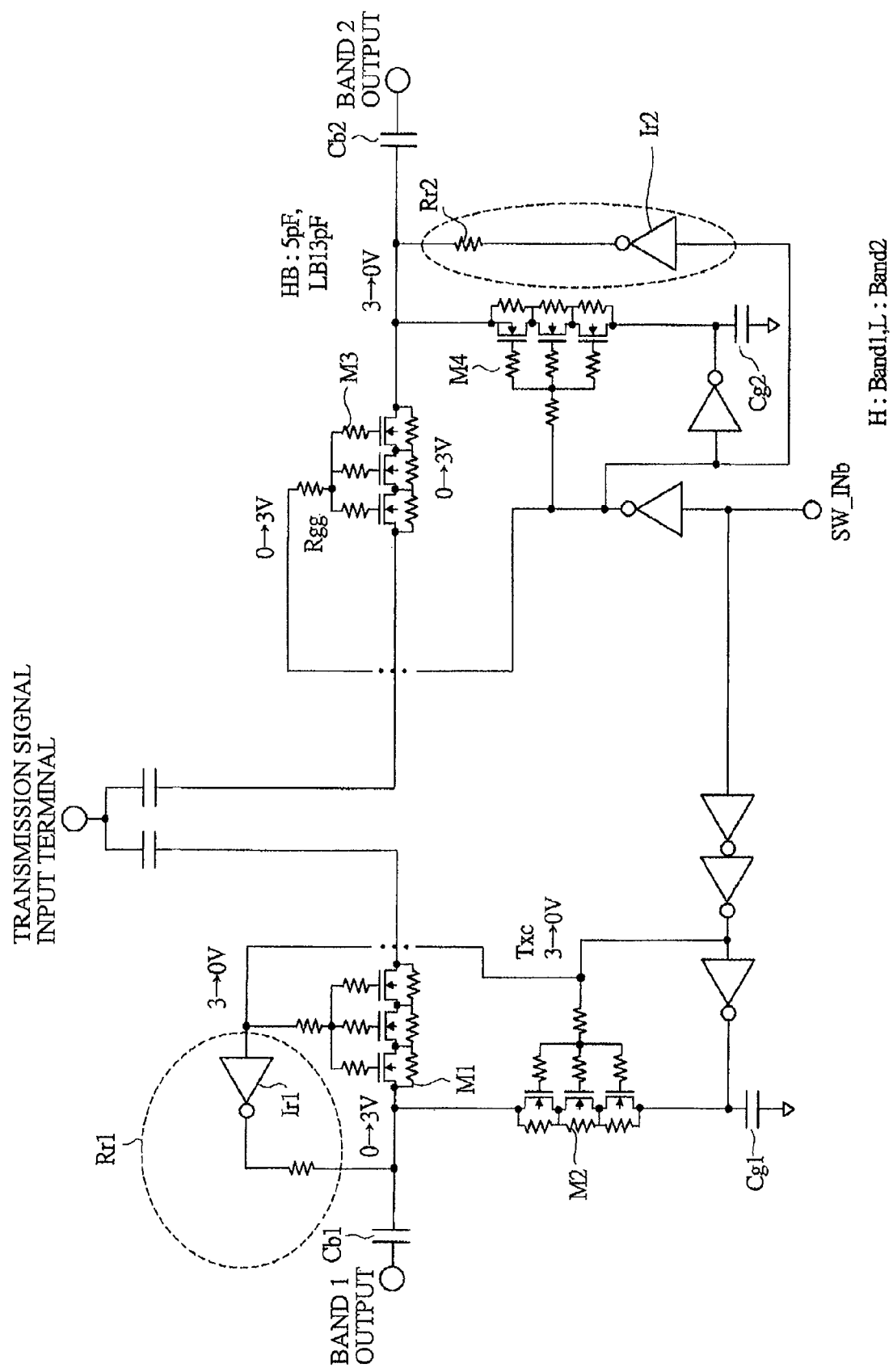
FIG. 12 is a circuit diagram representing the configuration of a switch circuit according to a fifth embodiment of the present invention.

FIG. 12 is a circuit diagram representing the configuration of a switch circuit according to the fifth embodiment of the present invention. The preceding switch circuit has been the one indicating that one antenna ANT is used either on the input side or on the output side. In contrast, this switch circuit differs from the ones in the preceding diagrams, and is a switch circuit for switching which of two output terminals (a Band 1 output terminal and a Band 2 output terminal) an input signal input from a transmission signal input terminal Pin passes through.

This switch circuit has an input terminal for switching SW_INb as the control terminal.

When the input terminal for switching SW_INb is at an "H" level, the input signal input from the transmission-signal input terminal Pin is output from the Band 1 output terminal. On the other hand, when the input terminal for switching SW_INb is at an "L" level, the input signal input from the input signal transmission-signal input terminal Pin is output from the Band 2 output terminal.

The input terminal for switching SW_INb controls the gate terminal of each of the switches M1, M2, M3, and M4. In this case, an N-type MOSFET is used for the switches M1 and M3 which connect the transmission-signal input terminal Pinto each output terminal, a P-type MOSFET is used for the shunt switches M2 and M4, and the input signal at the input terminal for switching SW_Inb is used for charging the capacitors Cb1 and Cb2 inserted immediately before the respective output terminals.

Figure 13:
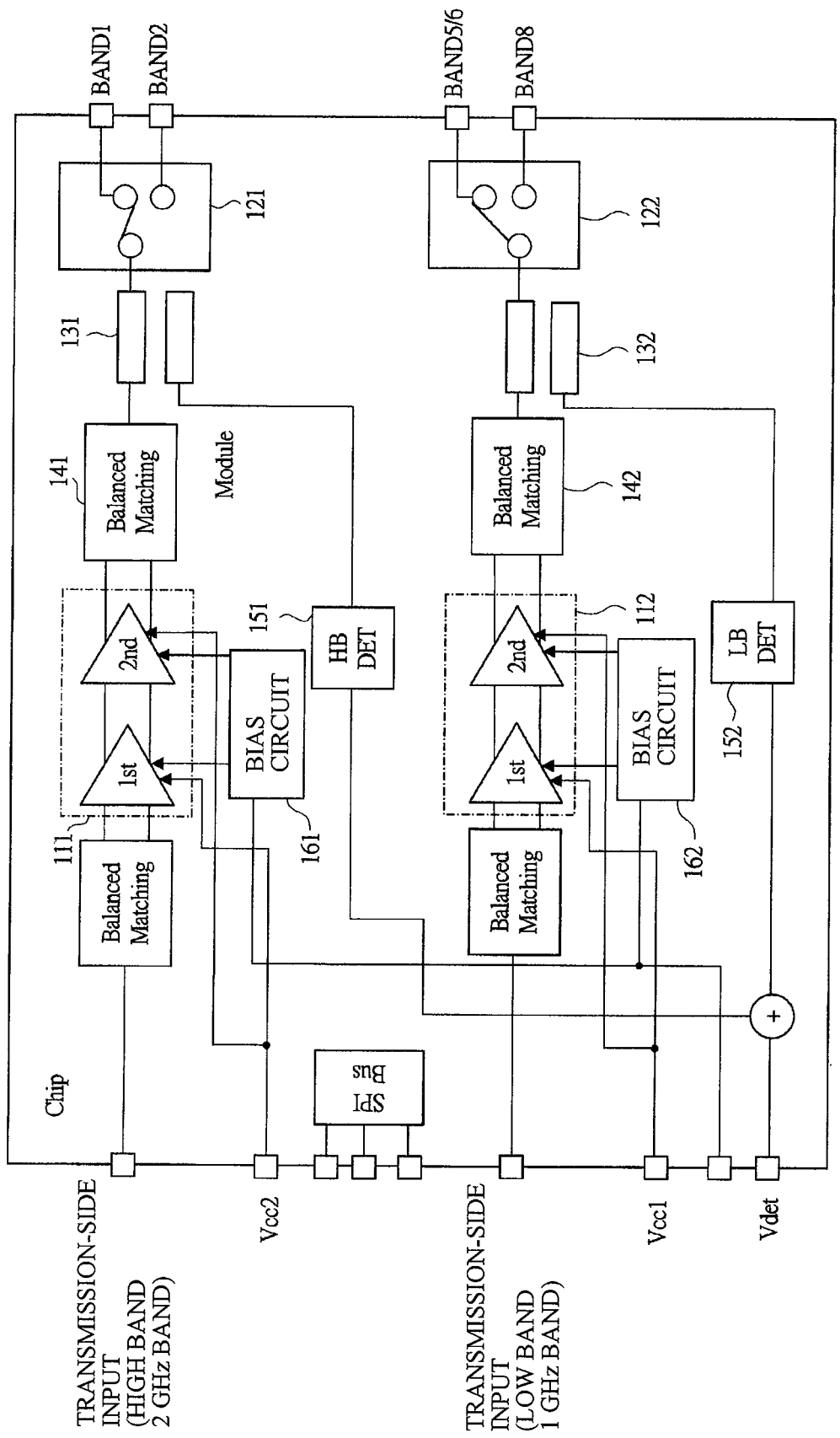
FIG. 13 is a conceptual diagram representing how the switch circuit of FIG. 12 is used in the antenna switch.

FIG. 13 is a conceptual diagram representing how the switch circuit of FIG. 12 is used in the antenna switch. In this diagram, a dual-band system using both 1 GHz band and 2 GHz band is assumed. However, the present invention can be applied also to a tri-band system or a multi-band system.

In W-CDMA, the output peak is low because the band spread is performed. Accordingly, three-stage amplification as with GSM is seldom performed, and the amplification is usually performed using two-stage amplification devices 111 and 112 as in FIG. 13.

The respective outputs of the two-stage amplification devices 111 and 112 are input to couplers 131 and 132 via matching circuits 141 and 142.

The couplers 131 and 132 detect the output voltage, and detector circuits 151 and 152 transmit the current transmission power to a non-illustrated control circuit. The non-illustrated control circuit controls the transmission power by adjusting the operation voltage of the two-stage amplification devices 111 and 112 and by adjusting the bias current via bias circuits 161 and 162.

The switch circuit of FIG. 12 is applied as switch circuits 121 and 122 of this diagram. In FIG. 12, the Band 1 output and the Band 2 output are depicted, while in the switch circuit 122 which is inserted on the low frequency side, a Band 5/6 output and a Band 8 output are depicted.

Figure 14:
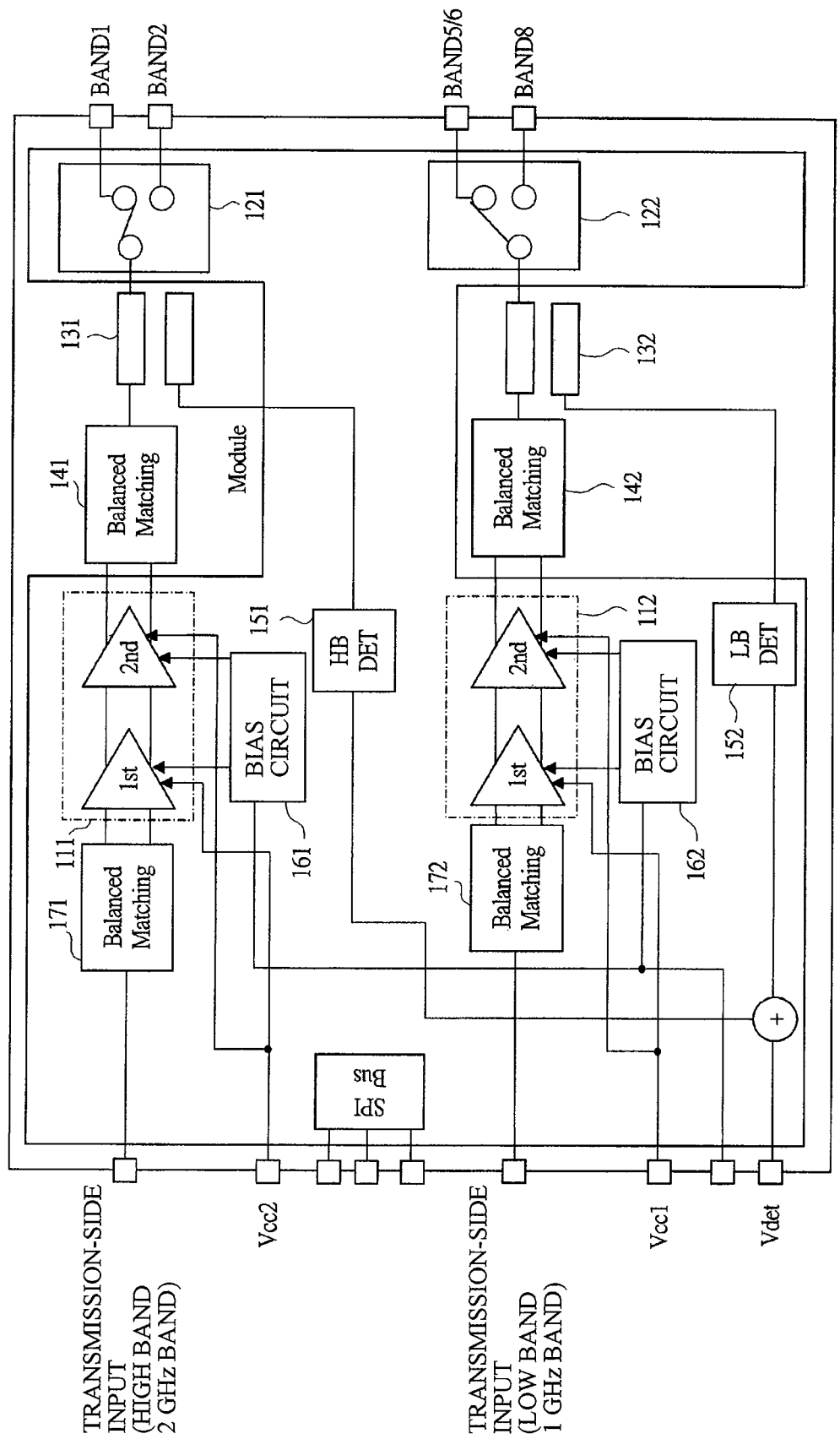
FIG. 14 is a diagram representing an example having the antenna switch of FIG. 13 integrated on one chip SOICMOS integrated circuit.

Moreover, FIG. 14 is a diagram representing an example in which the antenna switch of FIG. 13 has been integrated on one chip SOICMOS integrated circuit. In this manner, also in the W-CDMA system, the couplers 131 and 132 and matching networks 141 and 142 are made replaceable so as to be able to achieve single-chip integration.

Thus, the present invention can be applied not only to the input/output switching in GSM system, but also to the output destination switching in W-CDMA system without using a negative bias circuit.

Sixth Embodiment

Finally, a sixth embodiment of the present invention will be described.

As the transmission output power decreases to the order of 1 mW, if the two-stage amplification devices 111 and 112 represented by FIG. 14 are stopped and the transmission signal is output, as it is, without being amplified, then the reduction in power consumption can be achieved.

Figure 15:
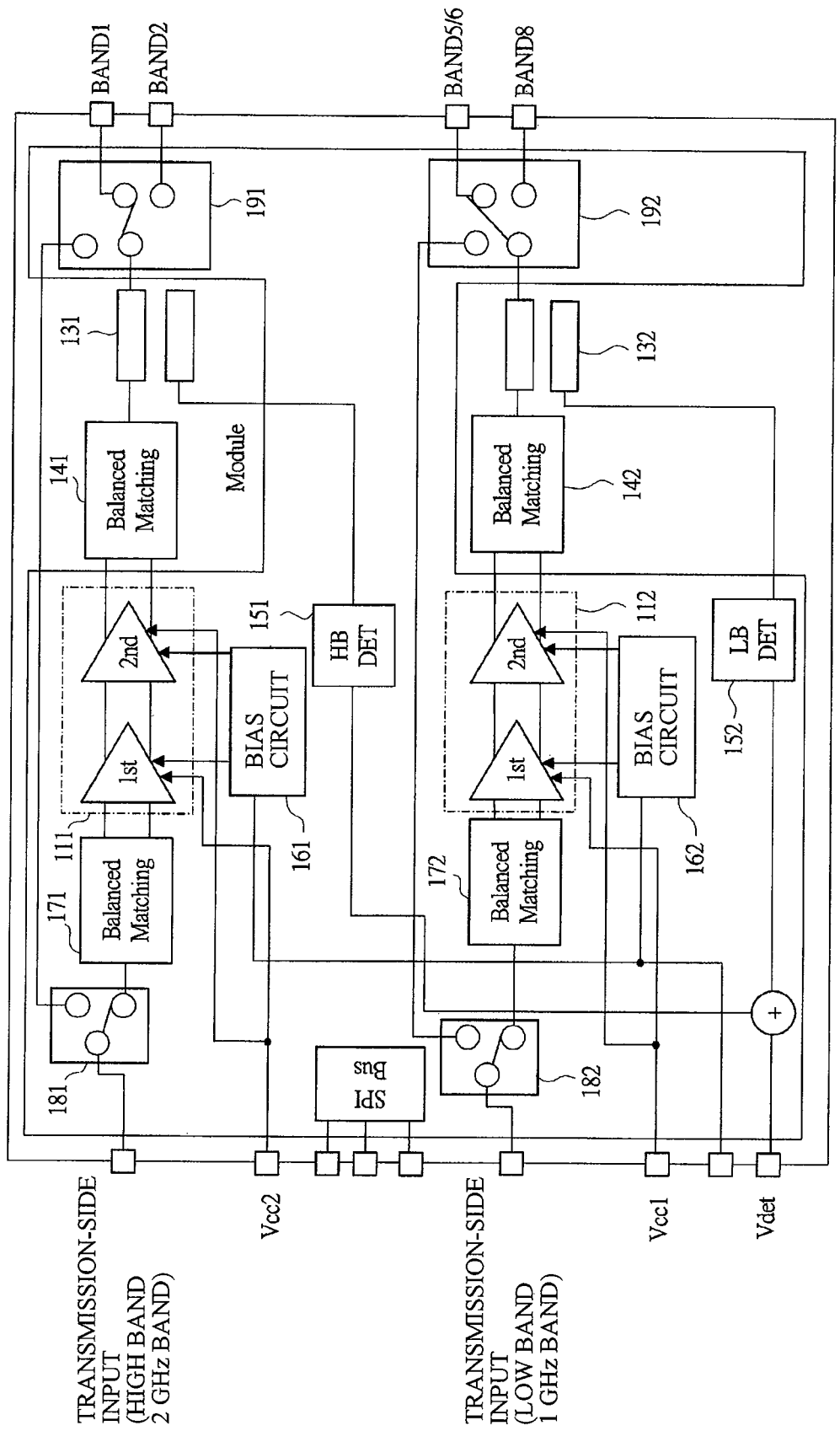
FIG. 15 is a conceptual diagram representing the configuration of an antenna switch according to a sixth embodiment of the present invention.

FIG. 15 is a conceptual diagram representing the configuration of an antenna switch according to the sixth embodiment of the present invention. This antenna switch is characterized in switch circuits 181 and 182 for providing a bypass path and in switch circuits 191 and 192 for replacing the switch circuits 121 and 122 according to the fifth embodiment.

The switch circuits 181 and 182 are switch circuits for determining whether or not a non-illustrated control circuit uses a bypass according to the outputs of the detector circuits 151 and 152. Although omitted in the diagram, a signal for controlling this switch is output from the non-illustrated control circuit.

The switch circuits 191 and 192 are the switch circuits 121 and 122 also capable of switching the input side.

Figure 16:
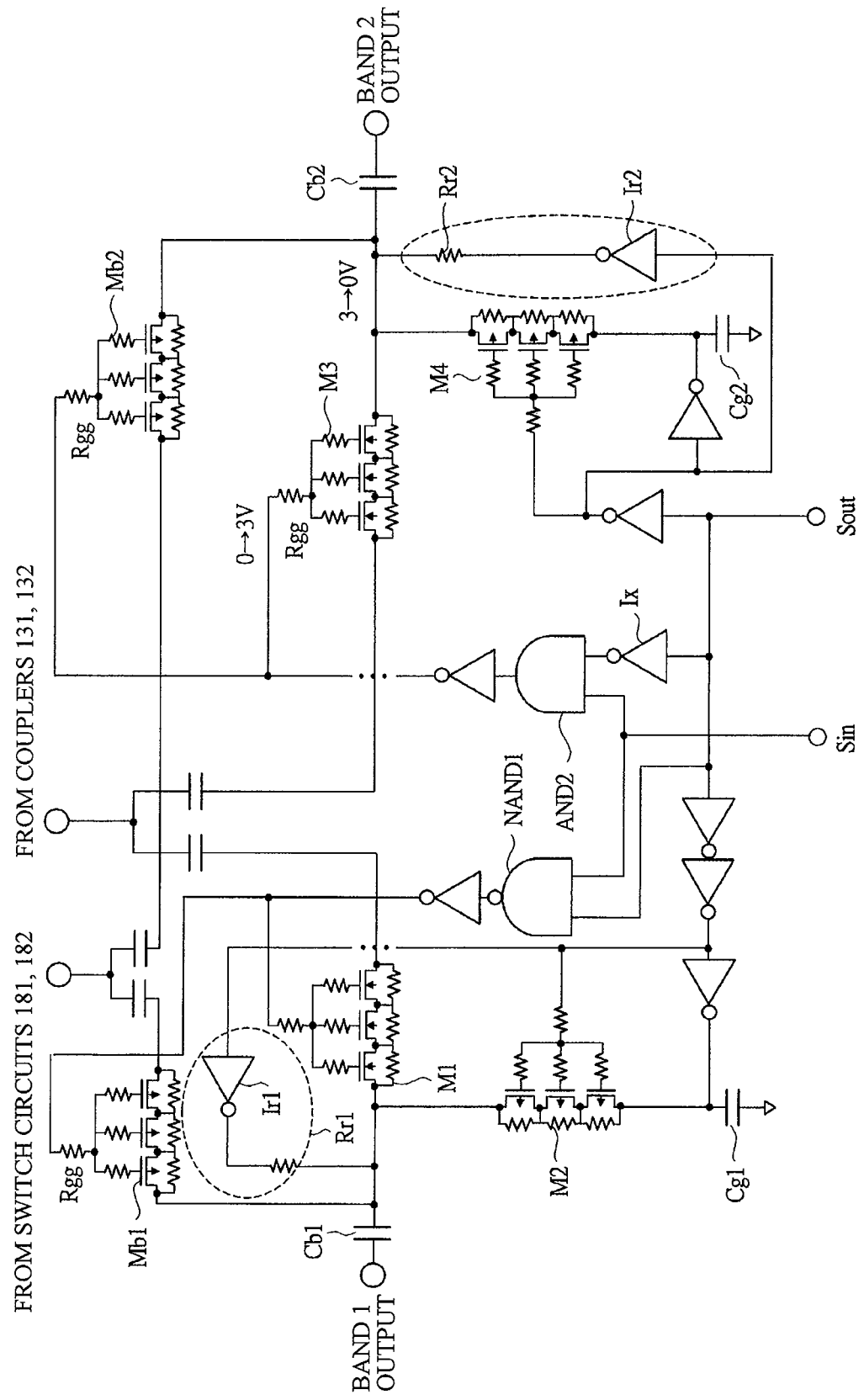
FIG. 16 is a conceptual diagram representing the configuration of a switch circuit according to the sixth embodiment of the present invention.

FIG. 16 is a circuit diagram representing the configuration of a switch circuit according to the sixth embodiment of the present invention.

In this switch, there are two control terminals: an input-side control terminal Sin and an output-side control terminal Sout. The input-side control terminal Sin and the output-side control terminal Sout are combined using gates NAND1 and AND2, and thus selection of the input terminal/output terminal is performed.

The output of NAND1 is inverted by an inverter and then input to the gate terminal of the switch M1 and to the gate terminal of a switch Mb1 which is newly built in the embodiment. In contrast to the switch M1 being an N-type MOSFET, a P-type MOSFET is used for the switch Mb1, and thus when the output of NAND1 is "H", the signal having passed through the bypass side becomes the input signal while when it is "L", the amplified signal having passed through the two-stage amplification devices 111 and 112 becomes the input signal.

The output of AND2 is also inverted by an inverter and then input to the gate terminal of a switch Mb2 which is newly built in the embodiment. The switch M3 comprises an N-type MOSFET and the switch Mb2 comprises a P-type MOSFET. Thus, the signal on the bypass side is defined as the input signal when the output of AND2 is "H", while the signal having passed through the switch circuits 181 and 182 is defined as the input signal when the output of AND2 is "L".

Both NAND1 and AND2 use the input-side control terminal Sin as one of the inputs.

On the other hand, NAND1 uses the output-side control terminal Sout as the input as it is, while AND2 uses the output-side control terminal Sout inverted by an inverter Ix. Thus, only either one of the Band 1 output and the Band 2 output operates as the output terminal.

The input-side control terminal Sin is a control terminal for determining whether the signal of the bypass path having passed through the switch circuits 181 and 182 is defined as the input signal or the amplified signal having passed through the two-stage amplification devices 111 and 112 is defined as the input signal. When this control terminal is "H", the amplified signal having passed through the two-stage amplification devices 111 and 112 is defined as the input signal. On the other hand, when this control terminal is "L", the signal of the bypass path having passed through the switch circuits 181 and 182 is defined as the input signal.

On the other hand, the output-side control terminal Sout is an output control terminal for determining whether the signal is caused to pass through the Band 1 output or through the Band 2 output. When this control terminal is "H", the Band 1 output is selected as the output, while when it is "L", the Band 2 output is selected as the output.

By employing the above-described configuration, not only the switching of the output terminals but the switching of the input terminals is possible.

In this case, in the embodiment, the signal at the output-side control terminal Sout is coupled via inverters Ir1 and Ir2 and resistors Rr1 and Rr2, and thus the charging/discharging of the capacitors Cb1 and Cb2 inserted immediately before the respective output terminals is accelerated. This allows realizing a function equivalent to that of the second embodiment. In this case, the configuration using the one-shot pulse generation circuit PG as in FIG. 5 may be possible.

In this manner, even when a bypass is used, the present invention is applicable without using a negative bias circuit. In addition, the present invention is applicable not only in the switching of transmission/reception but also in the switching whether either of two transmission terminals is used.

The invention of the present inventor has been described specifically based on the embodiments, but it is obvious that the present invention is not limited to the embodiments and various modifications are possible without departing from the scope of the invention.

What is claimed is:

1. A switch circuit for determining whether an antenna is coupled to an external circuit, the switch circuit comprising a first switch passing an output of the external circuit to the antenna, a capacitor at an electrical connection point between the first switch and the external circuit, wherein
    a polarity of a control signal of the first switch is inverted by an inverter, and the inverted control signal is coupled to the connection point between the first switch and the capacitor,
    the switch circuit further comprises a first resistor included between the connection point and the inverter, a second resistor coupled in parallel to the first resistor, and a resistor opening/closing switch, and
    a value of the first resistor is made variable by opening/closing the resistor opening/closing switch.

2. The switch circuit according to claim 1, further comprising a one-shot pulse generation circuit to which the control signal of the first switch is input, wherein
    with a change in the control signal of the first switch as a timing, the one-shot pulse generation circuit opens/closes the resistor opening/closing switch during a predetermined period.

3. The switch circuit according to claim 1, wherein the first switch comprises an N-type FET, and wherein the control signal is input to a gate terminal of the N-type FET constituting the first switch.

4. The switch circuit according to claim 1, wherein the first switch comprises a P-type FET, and wherein the control signal is input to a gate terminal of the P-type FET constituting the first switch.

5. A semiconductor device using the switch circuit according to claim 1.

6. A portable wireless device using the semiconductor device according to claim 5.

7. A switch circuit for determining whether an antenna is coupled to an external circuit, the switch circuit comprising:
    a first switch passing an output of the external circuit to the antenna; and
    a second switch provided in the form of branching from a connection point between the first switch and the external circuit, the second switch being for grounding the external circuit when decoupled from the antenna, wherein
    the first switch and the second switch are controlled with a same control signal, and wherein
    the control signal is inverted so as to determine a potential of a ground terminal of the second switch,
    the switch circuit further comprising a capacitor at an electrical connection point among the first switch, the second switch, and the external circuit, wherein an inverted signal of the control signal is used for charging/discharging the capacitor.

8. The switch circuit according to claim 7, wherein the inverted signal of the control signal is coupled to the capacitor via a resistor circuit.

9. The switch circuit according to claim 8, wherein the resistor circuit comprises a plurality of electrically detachable resistors coupled in parallel.

10. A switch circuit for determining whether an antenna is coupled either to a transmission circuit or to a reception circuit, the switch circuit comprising:
    a transmission-side switch circuit for determining whether the transmission circuit is coupled to the antenna or the transmission circuit is grounded; and
    a reception-side switch circuit for determining whether the reception circuit is coupled to the antenna or the reception circuit is grounded, wherein
    the transmission-side switch circuit and the reception-side switch circuit are controlled with one control signal, and wherein the control signal is input to a ground terminal of either one of the transmission-side switch circuit or the reception-side switch circuit, and an inverted signal of the control signal is input to the other ground terminal,
    the switch circuit further comprising a third capacitor at an electrical connection point between the transmission-side switch circuit and the transmission circuit, wherein a signal according to the control signal is used in charging/discharging the third capacitor.

11. A switch circuit for determining whether an antenna is coupled either to a transmission circuit or to a reception circuit, the switch circuit comprising:
    a transmission-side switch circuit for determining whether the transmission circuit is coupled to the antenna or the transmission circuit is grounded; and
    a reception-side switch circuit for determining whether the reception circuit is coupled to the antenna or the reception circuit is grounded, wherein
    the transmission-side switch circuit and the reception-side switch circuit are controlled with one control signal, and wherein
    the control signal is input to a ground terminal of either one of the transmission-side switch circuit or the reception-side switch circuit, and an inverted signal of the control signal is input to the other ground terminal,
    the switch circuit further comprising a fourth capacitor at an electrical connection point between the reception-side switch circuit and the reception circuit, wherein a signal according to the control signal is used in charging/discharging the fourth capacitor.

* * * * *